(12) United States Patent
Kloster et al.

(10) Patent No.: US 7,164,206 B2
(45) Date of Patent: Jan. 16, 2007

(54) STRUCTURE IN A MICROELECTRONIC DEVICE INCLUDING A BI-LAYER FOR A DIFFUSION BARRIER AND AN ETCH-STOP LAYER

(75) Inventors: Grant Kloster, Hillboro, OR (US); Jihperng Leu, Portland, OR (US); Lawrence Wong, Beaverton, OR (US); Andrew Ott, Hillsboro, OR (US); Patrick Marrow, Portlan, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/820,079

(22) Filed: Mar. 28, 2001

(65) Prior Publication Data

US 2002/0140103 A1 Oct. 3, 2002

(51) Int. Cl.
  *H01L 23/48* (2006.01)
  *H01L 23/52* (2006.01)
  *H01L 29/40* (2006.01)

(52) U.S. Cl. .............. 257/767; 257/760; 257/751; 257/752; 257/774

(58) Field of Classification Search ............... 257/760, 257/767, 751, 752, 774, 791, 750, 773; 438/624, 438/780, 622, 623
See application file for complete search history.

(56) References Cited

U.S. PATENT DOCUMENTS

| 6,211,061 | B1 * | 4/2001 | Chen et al. ............... 438/622 |
| 6,249,055 | B1 * | 6/2001 | Dubin ....................... 257/758 |
| 6,251,770 | B1 * | 6/2001 | Uglow et al. ............... 438/624 |
| 6,291,887 | B1 * | 9/2001 | Wang ........................ 257/758 |
| 6,429,119 | B1 * | 8/2002 | Chao et al. ................. 438/633 |
| 6,448,654 | B1 * | 9/2002 | Gabriel et al. ............. 257/758 |
| 2002/0090806 | A1 * | 7/2002 | Kie ............................ 438/618 |
| 2004/0207091 | A1 * | 10/2004 | Wang et al. ................ 257/758 |

OTHER PUBLICATIONS

Michael E. Clarke, "Introducing Low-k Dielectrics into Semiconductor Processing," Mykrolis Applications Notes (2004) p. 5.*
S. Bains, "Nanostructured Dielectrics Good Candidates for Next Generation Computer Chips," OE Reports, No. 194 (Feb. 2000) pp. 1-3.*
Donald G. Fink, and John M. Carroll, "Standard Handbook for Electrical Engineers," McGraw-Hill Book Co., New York (1969) pp. 2-30-2-31.*
Stanley Wolf, "Silicon Processing for the VLSI Era, vol. 4—Deep-Submicron Process Technology," Lattice Press, Sunset Beach, CA, (2002), p. 641.*

* cited by examiner

*Primary Examiner*—Nitin Parekh
(74) *Attorney, Agent, or Firm*—Michael D. Plimier

(57) ABSTRACT

The invention relates to a microelectronic device and a structure therein that includes a diffusion barrier layer having a first thickness and a first dielectric constant. An etch stop layer is disposed above and on the diffusion barrier layer. The etch stop layer has a second thickness and a second dielectric constant.

11 Claims, 6 Drawing Sheets

STRUCTURE IN A MICROELECTRONIC DEVICE INCLUDING A BI-LAYER FOR A DIFFUSION BARRIER AND AN ETCH-STOP LAYER

BACKGROUND OF THE INVENTION

1. Field of the Invention

The present invention relates to a semiconductor structure. More particularly, the present invention relates to formation of an etch stop and diffusion layer composite in a semiconductor structure. In particular, the present invention relates to a damascene process that uses an etch stop and a diffusion barrier layer composite.

2. Description of Related Art

Multiple levels of interconnect are being developed for integrated circuits. In such an integrated circuit, patterned conductive material on one interconnect level is electrically insulated from patterned conductive material on another interconnect level by an insulating layer of material such as, for example, silicon dioxide. The insulating layer is often referred to as an interlayer dielectric (ILD). The conductive materials are typically a metal or metal alloy. Connections between the conductive material at the various interconnect levels are made by forming openings in the insulating layers and providing an electrically conductive structure such that the patterned conductive material from different interconnect levels are brought into electrical contact with each other. These electrically conductive structures are often referred to as contacts or vias.

Semiconductor device features continue to shrink to accommodate more transistors per silicon wafer and improve device performance. Shrinking dimensions, however, results in an increased capacitance between metal lines. An increase in capacitance seriously degrades device performance because signal delay is proportional to the product of resistance with capacitance. One technique for increasing speed while reducing power consumption is to replace the traditional aluminum and aluminum alloy interconnects found on integrated circuits with a metal such as copper, which offers lower electrical resistance. Those skilled in the electrical arts will appreciate that by reducing resistance, electrical signals may propagate more quickly through the interconnect pathways on an integrated circuit. Furthermore, because the resistance of copper is significantly less than that of aluminum, the cross-sectional area of a copper interconnect line, as compared to an aluminum interconnect line, may be made smaller without incurring increased signal propagation delays based on the resistance of the interconnect.

As noted above, copper has electrical advantages, such as lower resistance per cross-sectional area, and greater immunity to electromigration. For all these reasons, manufacturers of integrated circuits find it desirable to include copper in their products. Another approach for reducing the resistance-capacitance (RC) delay and thence improving device performance is to use low-dielectric-constant (low-k) materials as an ILD in semiconductor devices because capacitance is proportional to the dielectric constant of the ILD.

The process integration of copper and ILD can be difficult due to the risk of etch-through of an underlying ILD layer at unlanded vias, and undesired reaction on underlying copper during via etch. In addition, copper can readily diffuse into ILD that adversely affect the quality of device such as leakage current and reliability between the lines. As a result, a separate layer is usually added to the integration flow to act as an etch stop and a diffusion barrier.

The diffusion barrier property of the added layer, however, results in a material with a high dielectric constant. For example, silicon nitrides ($Si_xN_yH_z$, in both stoichometric and solid solution ratios) have a dielectric constant of about 6.5 to about 10, and silicon carbides ($Si_wC_xN_yH_z$ in both stoichometric and solid solution ratios) have a dielectric constant of about 4.0 to about 5.0. This negatively impacts the overall effective dielectric constant ($k_{eff}$) between the metal lines. Consequently, increased RC delay results. RC delay can be minimized by reducing the thickness of the added layer, but this is prevented by the etch selectivity requirements for the added layer as an etch stop.

BRIEF DESCRIPTION OF THE DRAWINGS

In order that the manner in which the above recited and other advantages of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION OF THE INVENTION

Figure 1:
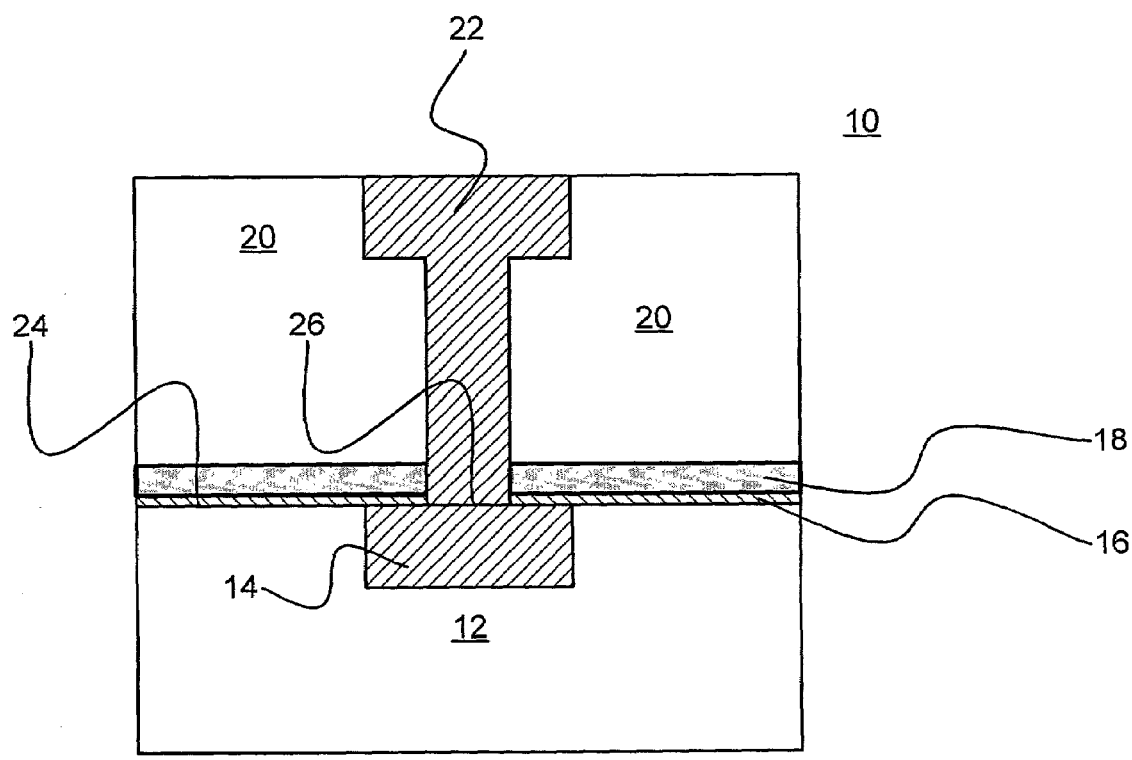
FIG. 1 is an elevational cross-section view of an inventive structure in a microelectronic device.

One embodiment relates to a structure in a semiconductor device that assists in reducing the resistance-capacitance (RC) delay. The inventive structure includes a diffusion barrier layer having a first thickness and a first dielectric constant. An etch stop layer is disposed above and on the diffusion barrier layer. The etch stop layer has a second thickness and a second dielectric constant. An interlayer dielectric (ILD) layer is disposed above and on the etch stop layer.

The terms, chip, integrated circuit, monolithic device, semiconductor device, and microelectronic device, are often used interchangeably in this field. The present invention is applicable to all the above as they are generally understood in the field.

The terms metal line, interconnect line, trace, wire, conductor, signal path and signaling medium are all related. The related terms listed above, are generally interchangeable, and appear in order from specific to general. In this field, metal lines are sometimes referred to as traces, wires, lines, interconnect, metalization, or simply metal. Metal lines, generally aluminum (Al), copper (Cu) or an alloy of Al and Cu, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), tungsten (W), and refractory metal suicides are examples of other conductors.

The terms contact and via, both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

The term vertical, as used herein, means substantially orthogonal to the surface of a substrate.

The following description also includes terms, such as upper, lower, first, second, etc. that are used for descriptive purposes only and are not to be construed as limiting. The embodiments of an apparatus or article of the present invention described herein can be manufactured, used, or shipped in a number of positions and orientation. Reference will now be made to the drawings wherein like structures will be provided with like reference designations. In order to show the structures of the present invention most clearly, the drawings included herein are diagrammatic representations of integrated circuit structures. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings.

The problem of a high dielectric constant and an inadequate etch stop and diffusion barrier can be resolved by using separate materials to act as the diffusion barrier and the etch stop. The diffusion barrier layer thickness can be reduced to its minimum and the etch stop can be a low-k material.

FIG. 1 illustrates a structure 10 in a microelectronic device. A substrate 12 that may include a trace 14 (or the top of a contact) includes an etch stop layer 18 above and on a diffusion barrier layer 16. The etch stop layer 18 may be an organic composition, and the diffusion barrier layer 16 may be an inorganic composition. Alternatively, the compositional order of etch stop layer 18 and diffusion barrier layer 16 may be reversed. An ILD layer 20 is disposed upon the etch stop layer 18- diffusion barrier layer 16 composite. A damascene contact 22 is disposed in a via. Contact 22 may electrically connect to trace 14 if it is present. In another embodiment, contact 22 may electrically connect through an unlanded via.

One embodiment of the present invention relates to two dissimilar layers that make up diffusion barrier layer 16 and etch stop layer 18. Where diffusion barrier layer 16 is an inorganic composition, etch stop layer 18 is an organic composition and visa versa. Another embodiment of the present invention relates to two dissimilar layers that make up diffusion barrier layer 16 and etch stop layer 18. In this embodiment, the two layers may be either organic or inorganic, but a given etch will be chosen to achieve an etch selectivity difference that is sufficiently large to make one layer an etch stop in relation to the other.

Additionally, ILD layer 20 may be chosen in concert with etch stop layer 18 such that a given etch recipe will be selective to etch stop layer 18. Accordingly, ILD layer 20 may be organic or inorganic, or it may be of the same organic/inorganic genus as etch stop layer 18 but chemically diverse with respect to etch response.

The following are examples of inorganic compositions that may be used, either for the diffusion barrier layer 16, the etch stop layer 18, and in selected embodiments, for the ILD layer 20. In one embodiment, the inorganic composition may be a silicon nitride in either a stoichiometric (e.g. $Si_3N_4$) or solid solution nonstoichiometric ($Si_xN_yH_z$) ratios. Additional to the selection of silicon nitrides, other inorganic compositions may be used. For example, silicon carbide may be selected and formed according to known methods or under any of the conditions set forth herein.

Another example of inorganic compositions that may be used is amorphous carbon nitride (e.g., a-C:$N_x$ and a-C:N:H) in both stoichiometric and nonstoichiometric solid solution ratios. Carbon nitride of these types may have a dielectric constant in the range from about 1.8 to about 3.6, and may be an embodiment for diffusion barrier layer 16. Formation of a carbon nitride layer may be carried out according to known methods or under any of the conditions set forth herein. For example, a carbon nitride layer may be formed by chemical vapor deposition (CVD), plasma-enhanced CVD (PECVD), low-pressure CVD (LPCVD), or plasma-enhanced LPCVD (PELPCVD). A carbon nitride layer may also be formed by physical vapor deposition (PVD) including reactive sputtering and radio-frequency (RF) sputtering. The carbon nitride layer may also be formed by atomic layer deposition (ALD). Additionally, the carbon nitride layer may be formed by a post-deposition process of a C:H film with a nitrogen-containing compound such as diatomic nitrogen, a hydrogen-nitrogen gas mixture, ammonia, and the like. The post-deposition process may be an anneal, a rapid thermal process (RTP) as is known in the art, a plasma treatment as is known in the art, or combinations thereof.

Another example of an inorganic composition that may be used includes aluminum oxides such as alumina and other stoichiometric and nonstoichiometric solid solutions. Another example of an inorganic composition that may be used includes aluminum nitrides in stoichiometric and nonstoichiometric solid solutions. Another example of an inorganic composition that may be used includes aluminum oxynitrides in stoichiometric and nonstoichiometric solid solutions.

Another example of an inorganic composition that may be used includes boron nitrides and boron oxynitrides in stoichiometric and nonstoichiometric solid solutions. Another example of an inorganic composition that may be used includes beryllium oxides such as beryllia, beryllium nitrides, and beryllium oxynitrides and other stoichiometric and nonstoichiometric solid solutions. Another example of an inorganic composition that may be used includes yttrium oxides such as yttria, yttrium nitrides, and yttrium oxynitrides, and other stoichiometric and nonstoichiometric solid solutions. These and other ceramic dielectrics may be used according to a selected application.

Formation of these and other ceramic dielectrics may be accomplished by methods such as PVD including reactive sputtering and RF sputtering. Other process flows may include CVD, PECVD, LPCVD, or PELPCVD. Additionally, ALD may be employed, and in one embodiment ALD may be used to form a given layer such as diffusion barrier layer 16. Additionally, these ceramic dielectrics may be treated by a post-deposition process that may be an anneal, an RTP, a plasma treatment, or combinations thereof.

Other inorganic compositions may include silica-based materials such as siloxanes, organosiloxanes, silsesquioxanes, aerogels and xerogels, or their porous materials thereof, and may be formed according to known techniques. Such dielectric materials comprises an oxide based film that is selected from the group consisting of carbon-doped oxide using polysiloxane, trimethyl silane (3MS), tetramethyl silane (4MS) with oxidants, hydrogen silsesquioxane (HSQ), methyl silsesquioxane (MSQ), mesoporous silica, porous carbon-doped oxide by CVD or spin on processes.

Organic compositions that may be used in connection with the present invention may include organic insulators selected from the group that includes polyimides, parylenes, polyarylethers, polynaphthalenes, and polyquinolines, bis-benzocyclobutene, polyphenylene, polyarylene, their copolymers or their porous polymers thereof. A commercially available polymer under the tradename FLARE™ sold by Honeywell Allied Signal Inc., of Morristown, N.J., or polymer under tradename SiLK™ or CYCLOTENE™ sold by Dow Chemical Company of Midland, Mich., or PAE II™ or Lo-K™ 2000, poly arylene ethers provided by the Schumacher Chemical Company which is a subsidiary of Air Products and Chemicals, Inc., Allentown, Pa. and Fairchild Technologies U.S.A., Inc. of Fremont, Calif., respectively, may be used to form ILD layer 20.

Referring again to FIG. 1, in the microelectronic device, structure 10 comprises diffusion barrier layer 16 that includes a first thickness and a first dielectric constant. Diffusion barrier layer 16 may have a thickness in a range from about one or two atomic monolayers to about 2,500 Å. Where diffusion barrier layer 16 is an inorganic composition as set forth herein, the dielectric constant may be in a range from about 4.5 to about to about 10, preferably less than about 10. Where diffusion barrier layer 16 is an inorganic material, it may be formed by a process flow as set forth herein.

In one embodiment, diffusion barrier layer 16 is an inorganic composition such as silicon nitride as set forth herein. Accordingly, etch stop layer 18 may be an organic composition as set forth herein, or an inorganic composition that is chemically diverse from diffusion barrier layer 16.

In one embodiment, the etch stop layer 18 has a chemical behavior under etch conditions that will make the etch selective to the ILD layer 20. For example, etch stop layer 18 may be an organic material such as a polymer and ILD layer 20 is selected to be an inorganic material such as silicon oxides, borosilicon oxides, and the like. In this embodiment, diffusion barrier layer 16 is an inorganic composition. Where etch stop layer 18 is an inorganic material, ILD layer 20 may be an organic layer such as a polymer as is known in the art or as set forth herein.

Etch stop layer 18 may be disposed above and on diffusion barrier layer 16. Etch stop layer 18 has a second thickness that may be greater than the first thickness of diffusion barrier layer 16. Etch stop layer may have a second dielectric constant in a range from about 1.8 to about 3. Overall, the combination of ILD layer 20, etch stop layer 18, and diffusion barrier layer 16 may have an effective dielectric constant, ($k_{eff}$) in the range from about 2.5 to about 3, preferably, less than about 3.0.

In one embodiment, structure 10 requires that diffusion barrier layer 16 comprises an organic composition and the etch stop layer 18 comprises an inorganic composition. In this embodiment, diffusion barrier layer 16 is fabricated from compositions as set forth herein. In this embodiment, ILD layer 20 is selected to be an organic composition as is known in the art or as set forth herein.

Two qualities for an etch stop layer are its dielectric constant and its selectivity with respect to the ILD layer 20. Selectivity is derived from the chemical difference between the materials during an etch. For example, organic polymers can act as etch stops for a silicon oxide such as silica, $SiO_2$, for a silicon oxyfluoride such as $Si_xO_yF_z$, carbon-doped oxides (CDOs) and other inorganic materials that serve as ILDs. The reverse is also true; inorganic materials such as oxides, nitrides and the like can act as etch stop materials for organic polymers. Even materials within the same class of inorganic or organic may have enough selectivity to act as an etch stop, as long as they are chemically different.

In a first non-limiting example embodiment, the ILD layer 20 is about 1 micrometer (micron) thick of a CDO (k is about 2.8). The etch stop layer 18 is about 0.06 micron of SiLK® (k is about 2.65). Finally, the diffusion barrier layer 16 is about 0.005 micron of silicon nitride, $Si_xN_yH_z$ (k is about 6.5). Overall, a calculated $k_{eff}$ is about 2.8 through the stack of ILD layer 20, etch stop layer 18, and diffusion barrier layer 16. This may represent an improvement over the state of the art with a 1.0 micron CDO ILD layer and a 0.06 micron silicon nitride layer, which gives a calculated $k_{eff}$ of about 2.9 through the two layers. The actual improvement within a fabricated device may be larger, because edge effects near traces contribute disproportionately to $k_{eff}$. Where diffusion barrier layer 16 is an inorganic composition as set forth in this example, formation thereof may be carried out by a PECVD, CVD, ALD, or sub-atmospheric CVD (SACVD) process at a temperature in a range from about 200° C. to about 400° C., a pressure from about 1 torr to about 5 torr, and for a deposition time from about 1 sec to about 60 sec. Formation of etch stop layer 18 in this first example is carried out by use of a spin-on process flow, wherein the etch stop layer 18 is spun on and heated to a temperature in a range from about 150 to about 400, at a flow rate in a range from about 1 cc/sec to about 6 cc/sec and a rotational speed in a range from about 500 rpm to about 6000 rpm. ILD layer 20 is next formed by a PECVD, CVD, ALD, or SACVD process at a temperature in a range from about 200° C. to about 400° C., a pressure from about 1 torr to about 5 torr, and for a deposition time from about 1 sec to about 60 sec.

In a second non-limiting example embodiment, processing is carried out as in the first example. The ILD layer 20 is about 1 micrometer (micron) thick of a CDO and k is about 2.8. The etch stop layer 18 is about 0.2 micron of SiLK® where k is in a range from about 1.9 to about 2.6, and preferably about 2. Finally, the diffusion barrier layer 16 is about 0.005 micron of silicon nitride, $Si_xN_yH_z$ (k is about 6.5). Overall, a calculated $k_{eff}$ is about 2.6 to about 2.8 through the stack of ILD layer 20, etch stop layer 18, and diffusion barrier layer 16. The actual improvement within a fabricated device is expected to be larger, because edge effects near traces contribute disproportionately to $k_{eff}$.

In a third non-limiting example embodiment, processing is carried out as in the first example. The ILD layer 20 is about 1 micron thick of a CDO and k is about 2.8. The etch stop layer 18 is about 0.2 micron of SiLK® and k is about 2. Finally, the diffusion barrier layer 16 is about 0.005 micron of silicon nitride, $Si_xN_yH_z$ (k is about 6.5). Overall, a calculated $k_{eff}$ is about 2.6 through the stack of ILD layer 20, etch stop layer 18, and diffusion barrier layer 16. The actual improvement within a fabricated device is expected to be larger, because edge effects near traces contribute disproportionately to $k_{eff}$.

As illustrated in FIG. 1, substrate 12 is disposed below and on the diffusion barrier layer 16. The electrically conductive trace 14 is disposed in the substrate 12. The ILD layer 20 is disposed on the etch stop layer 18, and the contact 22 is disposed in a trench recess that extends through the ILD layer 20, the etch stop layer 18, and the diffusion barrier layer 16. Contact 22 makes an electrical connection to trace 14 through a via that is landed on trace 14.

It can be seen that substrate 12 has an upper surface 24, and that electrically conductive trace 14, disposed in substrate 12 has a trace surface 26 that is substantially coplanar to upper surface 24 of substrate 12. Further, diffusion barrier layer 16 is above and on substrate 12 and trace 14. Etch stop layer 18 is above and on diffusion barrier layer 18. Additionally, ILD layer 20 is disposed above and on etch stop layer 18. As set forth above, diffusion barrier layer 16 and etch stop layer 18 may be mutually exclusively selected from either an organic composition or an inorganic composition. In another embodiment, both diffusion barrier layer 16 and etch stop layer 18 are selected from either organic or inorganic materials that have a sufficiently diverse response to an etch recipe that the etch recipe is selective to the diffusion barrier layer 16.

Diffusion barrier layer 16 has a thickness in a range from about one atomic monolayer to about 2,500 Å. Preferably, diffusion barrier layer 16 has a thickness in a range from about two atomic monolayers to about 2,000 Å. More preferably, diffusion barrier layer 16 has a thickness in a range from about 20 Å to about 1,000 Å. In any event, diffusion barrier layer 16 has a greater tendency to resist the diffusion of copper or other metalization materials, the closer a given diffusion barrier layer 16 is to the monocrystalline silicon of the microelectronic device, if monocrystalline silicon is present. Diffusion barrier layer 16 may be referred to as a first dielectric layer. In alternative embodiments, the first dielectric layer is selected from silicon nitride and silicon carbide.

In one embodiment, the diffusion barrier layer 16 has a first dielectric coefficient, the etch stop layer has a second dielectric coefficient. As a structure, ILD layer 20, diffusion barrier layer 18, and etch stop layer 16 have a $k_{eff}$ in a range from about 2.5 to about 3, preferably less than about 3.0.

Although structure 10 is illustrated with contact 22 in the form of a conductive dual-damascene article, the present invention may also have a conductive single-damascence article, wherein the conductive damascene article is in contact with the substrate, the first dielectric layer 16, the second dielectric layer 18, and the ILD layer 20.

Figure 2:
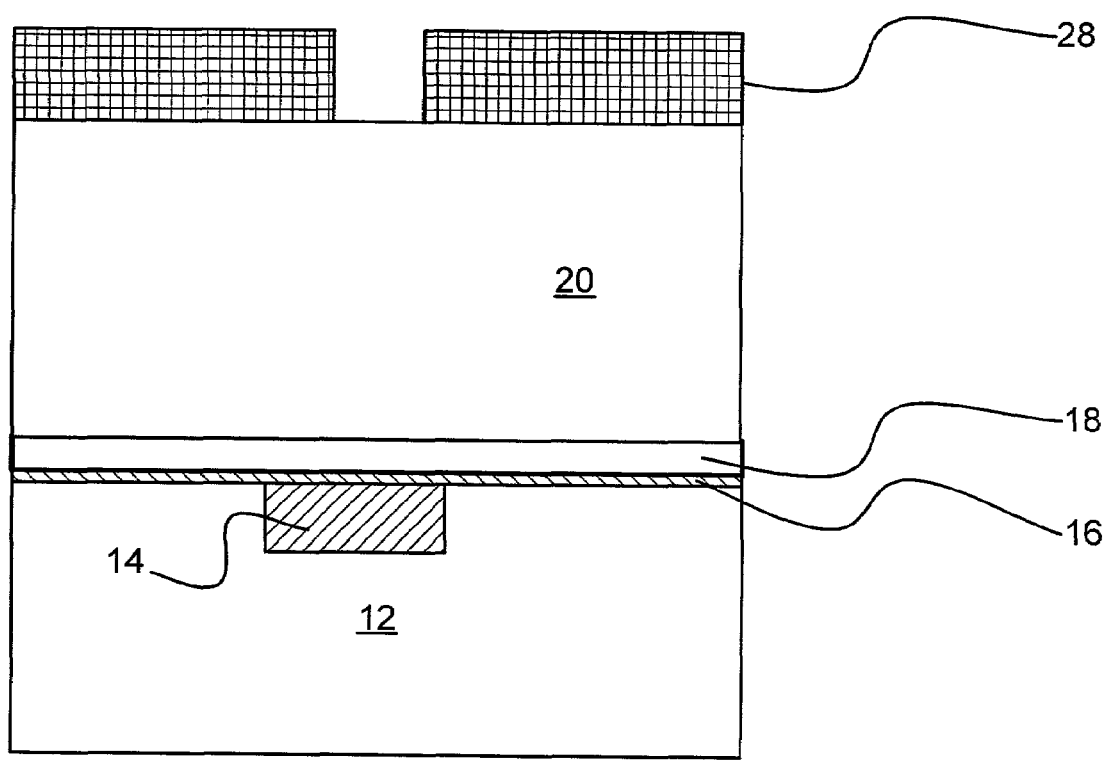
FIG. 2 is an elevation cross-section view of a semiconductor structure according to an embodiment during a process flow.

One nonlimiting embodiment of the inventive process may be carried out with the formation of a diffusion barrier layer 16 in a substrate 12 as illustrated in FIG. 2. Thereafter, an etch stop layer 18 is formed, and then an ILD layer 20 is formed as set forth herein. ILD layer 20 is patterned with a mask 28 such as a spin-on resist material.

Figure 3:
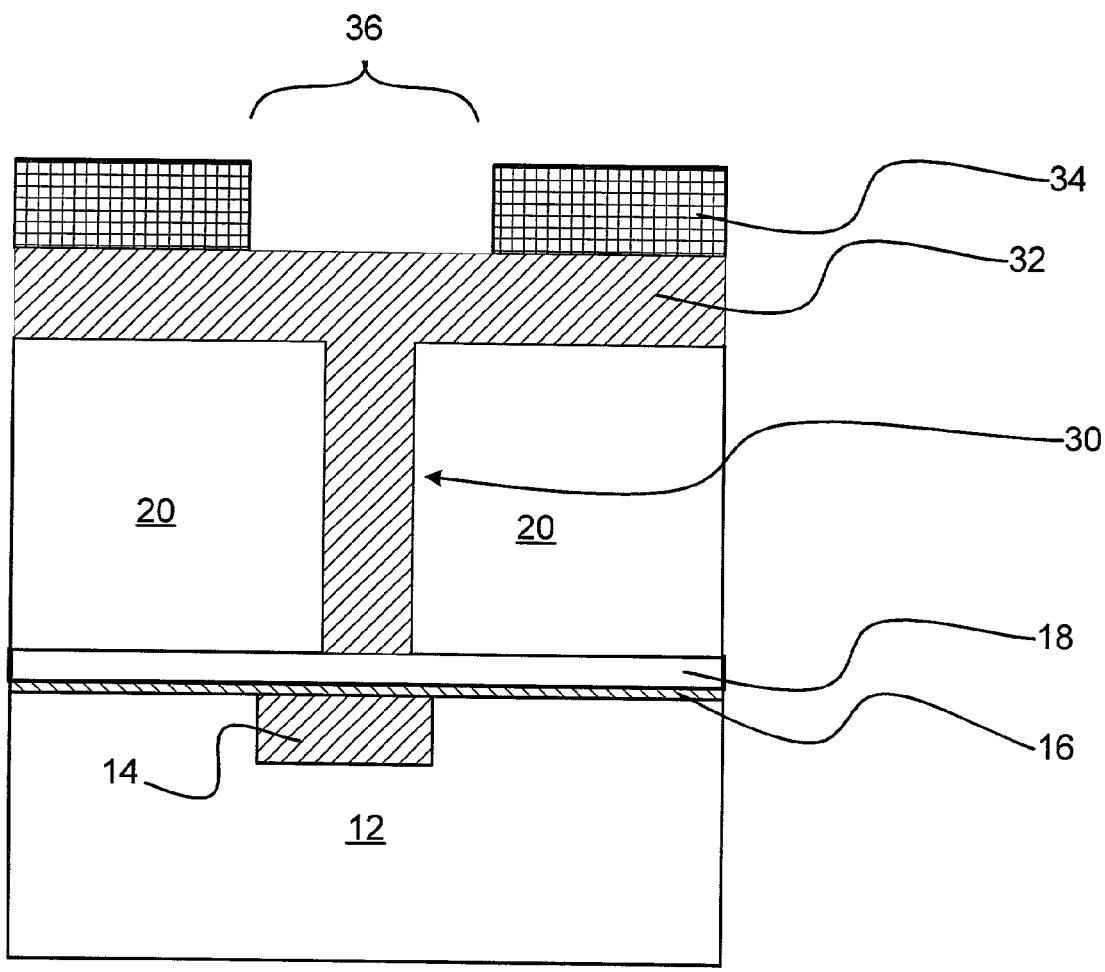
FIG. 3 is an elevation cross-section view of a semiconductor structure depicted in FIG. 2 after further processing.

In FIG. 3 the nonlimiting embodiment of the inventive process may be illustrated by the formation of a first recess 30 (also referred to herein as a via) in ILD layer 20 by an etch through mask 28 depicted in FIG. 2. Thereafter, an antireflective coating (ARC) layer 32 may be formed over ILD layer 20 in the first recess 30. In one embodiment, the ARC layer 32 may be a sacrificial layer antireflective material (SLAM). In this embodiment, the ARC layer 32 serves first the purpose of an antireflective material that assists in the patterning 36 of what will become a second recess such as a dual-damascene trench, and it serves the second purpose of protecting etch stop layer 18, diffusion layer 16, and trace 14 during the patterning and etching. In one embodiment, the ARC layer 32 may be a spin-on glass material. Although ARC layer 32 has been depicted as a spin-on glass, the ARC layer 32 may be selected from an organic and another inorganic composition.

Figure 4:
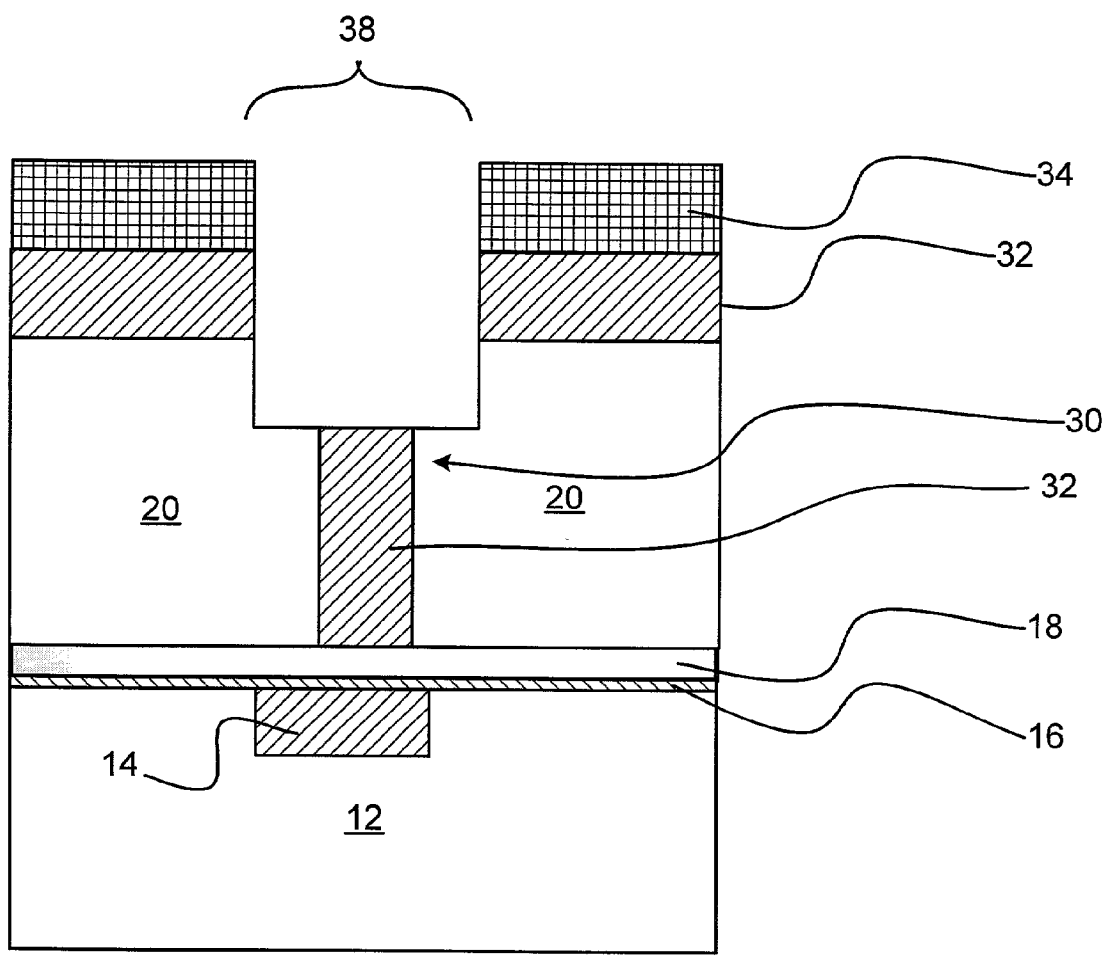
FIG. 4 is an elevation cross-section view of a semiconductor structure depicted in FIG. 3 after further processing.

FIG. 4 illustrates formation of a second recess 38 that is the dual-damascene trench to first recess 30. The second recess 38 is formed by an etch through mask 34 and through ARC layer 32, and partly into ILD layer 20. The second recess 38 at least partially intersects the first recess 30, and second recess 38 may be wider than the first recess 30. Thereafter, the mask 34 and the ARC layer 32 are removed. Mask 34 may be ashed and ARC layer 32 may be converted to an oxide such as silicon oxide like silica. Thereafter ARC layer 32 may be wet stripped in an oxide etch that is selective to ILD layer 20.

Figure 5:
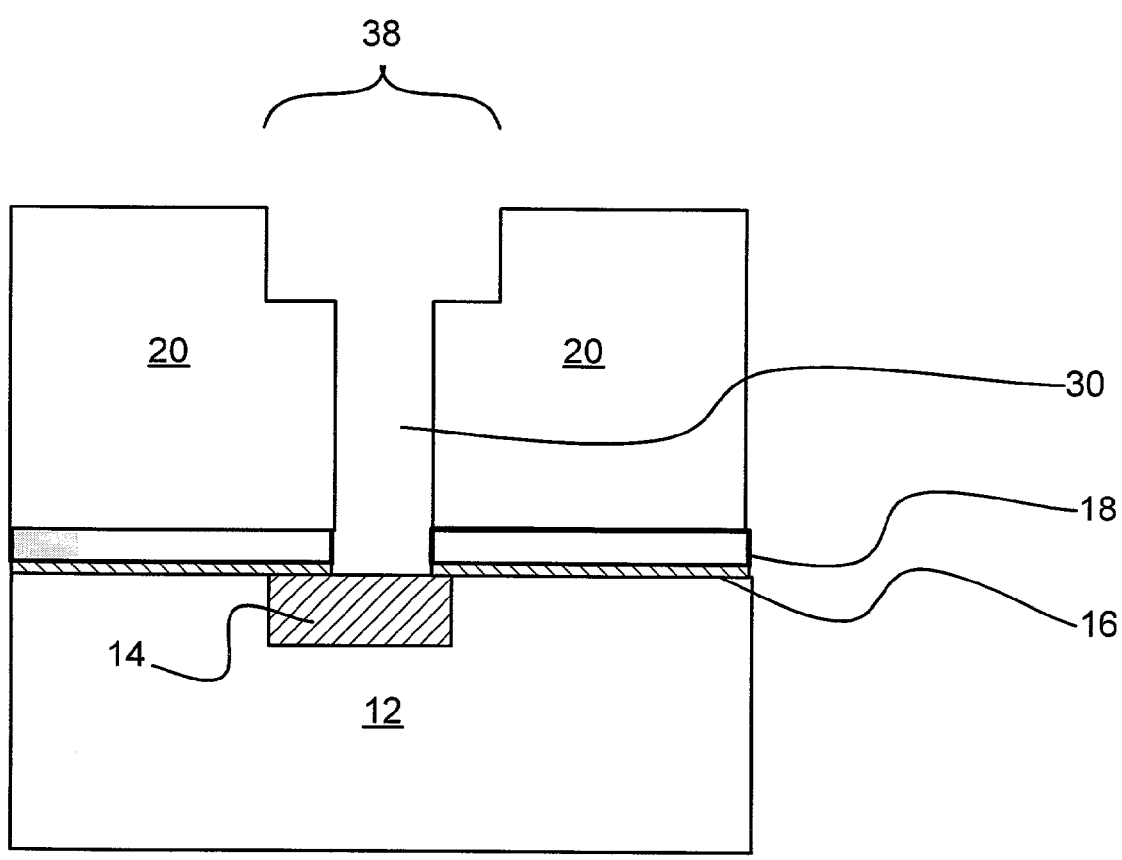
FIG. 5 is an elevation cross-section view of a semiconductor structure depicted in FIG. 4 after further processing.

After removing ARC layer 32, etching is carried out that penetrates etch stop layer 18 and diffusion barrier layer 16 as illustrated in FIG. 5. Thereafter, the first 30 and second recess 38 are filled with a metal such as copper, copper alloys, and the like. In another embodiment, the first 30 and second 38 recess are filled with a metal such as gold, gold alloys and the like. In another embodiment, the first 30 and second 38 recess are filled with a metal such as silver, silver alloys and the like. In another embodiment, the first 30 and second 38 recess are filled with a metal such as aluminum, aluminum alloys and the like. In any event, if one of the above-embodiments is not selected, one of ordinary skill in the art may select a metal or conductive material that is suitable to the specific application.

Alternatively, the formation of the recess may be a single damascene recess. Additionally, the via may be a contact that may act as a landed or unlanded via contact for a subsequent level of metalization.

Figure 6:
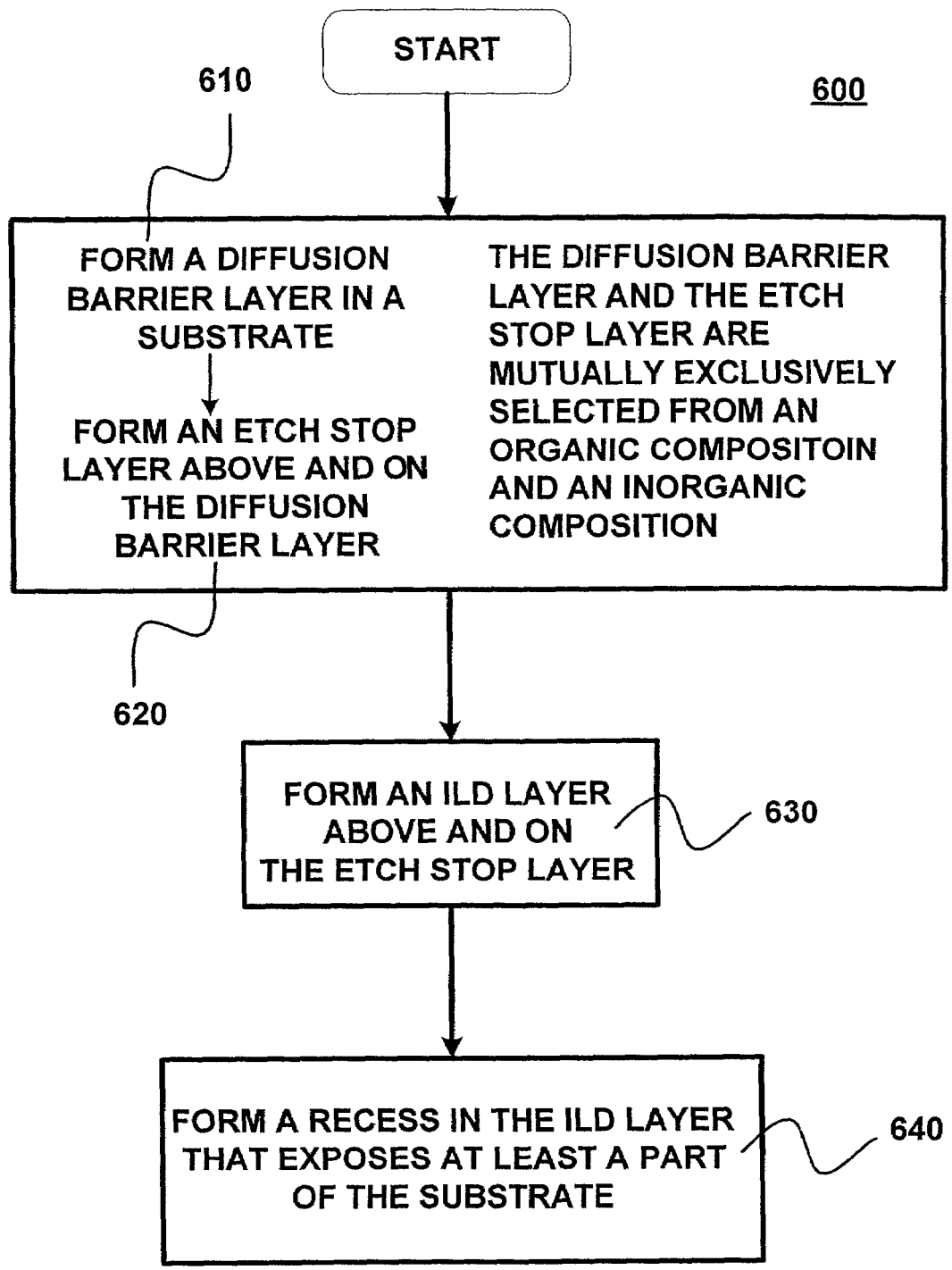
FIG. 6 is a process flow diagram according to an embodiment.

FIG. 6 is a process flow illustration 600 of an inventive embodiment. A diffusion barrier layer is formed 610 in a substrate and an etch stop layer is formed 620 above and on the diffusion barrier layer. In this process embodiment, the diffusion barrier layer and the etch stop layer are selected from mutually exclusively organic or inorganic compositions as set forth herein although they may also be both one or the other with significantly different etch and/or oxidation responses. The process flow may continue with the formation 630 of a ILD layer above and on the etch stop layer. Next, a recess is formed 640 in the ILD layer. In one embodiment, forming 640 a recess includes forming first recess 30 and second recess 38 as set forth herein. In another embodiment, forming 640 a recess includes forming a single-damascene via as set forth herein.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. In a microelectronic device, a structure on a substrate comprising:

a diffusion barrier layer comprising an organic composition disposed above and on the substrate, the diffusion barrier layer having a first thickness and a first dielectric constant, wherein the first thickness comprises a range from about one atomic monolayer to about 1000 angstroms;

an etch stop layer comprising an inorganic composition above and on the diffusion barrier layer, the etch stop layer having a second thickness, and a second dielectric constant; and an interlayer dielectric (ILD) layer disposed above and on the etch stop layer, wherein the structure has an effective dielectric constant in a range less than about 3.

2. In a microelectronic device, a structure on a substrate comprising:

a diffusion barrier layer disposed above and on the substrate, the diffusion barrier layer having a first thickness and a first dielectric constant, wherein the first thickness comprises a range from about one atomic monolayer to about 1000 angstroms, and wherein the diffusion barrier layer is selected from arylene, parylene, and arylene ether polymers, and fluorinated polyimides;

an etch stop layer above and on the diffusion barrier layer, the etch stop layer having a second thickness, and a second dielectric constant; and an interlayer dielectric (ILD) layer disposed above and on the etch stop layer, wherein the structure has an effective dielectric constant in a range less than about 3.

3. In a microelectronic device, a structure on a substrate comprising:

a diffusion barrier layer disposed above and on the substrate, the diffusion barrier layer having a first thickness and a first dielectric constant, wherein the first thickness comprises a range from about one atomic monolayer to about 1000 angstroms;

an etch stop layer above and on the diffusion barrier layer, the etch stop layer having a second thickness, and a second dielectric constant;

an interlayer dielectric (ILD) layer disposed above and on the etch stop layer, wherein the structure has an effective dielectric constant in a range less than about 3;

an electrically conductive trace disposed in the substrate; and a contact disposed in a recess that extends through the ILD layer, the etch stop layer, and the diffusion barrier layer, and wherein the contact makes an electrical connection to the trace, wherein the contact is a single-damascene contact article.

4. In a microelectronic device, a structure on a substrate comprising:

a diffusion barrier layer disposed above and on the substrate, the diffusion barrier layer having a first thickness and a first dielectric constant, wherein the first thickness comprises a range from about one atomic monolayer to about 1000 angstroms;

an etch stop layer above and on the diffusion barrier layer, the etch stop layer having a second thickness, and a second dielectric constant;

an interlayer dielectric (ILD) layer disposed above and on the etch stop layer, wherein the structure has an effective dielectric constant in a range less than about 3 an electrically conductive trace disposed in the substrate;

a first recess in the ILD layer with a first width and extending from a bottom surface of the ILD layer up to a position partway through the ILD layer;

a second recess in the ILD layer with a second width wider than the first width and extending from the top of the first recess to the top of the ILD layer; and a contact disposed in the first and second recesses, wherein the contact makes an electrical connection to the trace.

5. In a microelectronic device, a structure on a substrate comprising:

a diffusion barrier layer disposed above and on the substrate, the diffusion barrier layer having a first thickness and a first dielectric constant, wherein the first thickness comprises a range from about one atomic monolayer to about 1000 angstroms;

an etch stop layer above and on the diffusion barrier layer, the etch stop layer having a second thickness, and a second dielectric constant;

an interlayer dielectric (ILD) layer disposed above and on the etch stop layer, the ILD layer having a third thickness greater than the second thickness; and wherein the structure has an effective dielectric constant in a range less than about 3.

6. The structure according to claim 5, further comprising:

an electrically conductive trace disposed in the substrate; and a contact disposed in a recess that extends through the ILD layer, the etch stop layer, and the diffusion barrier layer, and wherein the contact makes an electrical connection to the trace.

7. The structure according to claim 5, wherein:

the third thickness is at least about 5 times as thick as the second thickness.

8. The structure according to claim 7, wherein:

the second thickness is at least about 10 times as thick as the first thickness.

9. The structure according to claim 5, wherein the second thickness is greater than the first thickness.

10. The structure according to claim 9, wherein the second thickness is at least about 10 times as thick as the first thickness.

11. The structure according to claim 5, wherein:

the diffusion barrier layer comprises silicon nitride;

the etch stop layer comprises an organic polymer;

the ILD layer comprises a carbon doped oxide;

the third thickness is at least about 5 times as thick as the second thickness; and the second thickness is at least about 10 times as thick as the first thickness.

* * * * *